(12) United States Patent
Kim

(10) Patent No.: US 7,061,988 B2
(45) Date of Patent: Jun. 13, 2006

(54) INTERLEAVER MEMORY ACCESS APPARATUS AND METHOD OF MOBILE COMMUNICATION SYSTEM

(75) Inventor: Dae Sik Kim, Euiwang-Shi (KR)

(73) Assignee: LG Electronics Inc., Seoul (KR)

( * ) Notice: Subject to any disclaimer, the term of this patent is extended or adjusted under 35 U.S.C. 154(b) by 764 days.

(21) Appl. No.: 10/160,167

(22) Filed: Jun. 4, 2002

(65) Prior Publication Data

US 2002/0184456 A1  Dec. 5, 2002

(30) Foreign Application Priority Data

Jun. 5, 2001  (KR) ............................. 2001-31389

(51) Int. Cl.
  *H04L 27/04*  (2006.01)
(52) U.S. Cl. ..................................... 375/295
(58) Field of Classification Search ............... None
  See application file for complete search history.

(56) References Cited

U.S. PATENT DOCUMENTS

| | | | |
|---|---|---|---|
| 5,056,105 A   | 10/1991 | Darmon et al. ................. 375/1 |
| 5,745,497 A * | 4/1998  | Ben-Efraim et al. ......... 714/702 |
| 6,411,654 B1* | 6/2002  | Furutani et al. ............ 375/262 |
| 6,744,744 B1* | 6/2004  | Tong et al. .................. 370/320 |
| 6,747,948 B1* | 6/2004  | Sarraf et al. ................ 370/210 |

\* cited by examiner

*Primary Examiner*—Don N. Vo
(74) *Attorney, Agent, or Firm*—Fleshner & Kim, LLP

(57) ABSTRACT

An interleaver memory access apparatus and method of a mobile communication system is disclosed in which code symbols are written in an interleaver memory by using a column address and the code symbols stored in the interleaver memory are simultaneously read by using a row address Accordingly, by implementing a simple addressing for a memory access, the a performance of an overall mobile communication system as well as a data access speed is improved.

19 Claims, 9 Drawing Sheets

FIG. 2
BACKGROUND ART

| ROW | | | | | | | | | | | | | | | | | | |
|---|---|---|---|---|---|---|---|---|---|---|---|---|---|---|---|---|---|---|
| 1 | 33 | 65 | 97 | 129 | 161 | 193 | 225 | 257 | 289 | 321 | 353 | 385 | 417 | 449 | 481 | | 513 | 545 |
| 2 | 34 | 66 | 98 | 130 | 162 | 194 | 226 | 258 | 290 | 322 | 354 | 356 | 418 | 450 | 482 | | 514 | 546 |
| 3 | 35 | 67 | . | . | . | . | . | . | . | . | . | . | . | . | . | | 515 | 547 |
| 4 | 36 | . | 100 | . | . | . | . | . | . | . | . | . | . | . | . | | 516 | 548 |
| 5 | 37 | . | . | 132 | . | . | . | . | . | . | . | . | . | . | . | | 517 | 549 |
| 6 | 38 | . | . | . | 166 | . | . | . | . | . | . | . | . | . | . | | 518 | 550 |
| 7 | 39 | . | . | . | . | 199 | . | . | . | . | . | . | . | . | . | | 519 | 551 |
| 8 | 40 | . | . | . | . | . | 232 | . | . | . | . | . | . | . | . | | 520 | 552 |
| 9 | 41 | . | . | . | . | . | . | 265 | . | . | . | . | . | . | . | | 521 | 553 |
| 10 | 42 | . | . | . | . | . | . | . | 298 | . | . | . | . | . | . | | 522 | 554 |
| 11 | 43 | . | . | . | . | . | . | . | . | 331 | . | . | . | . | . | | 523 | 555 |
| 12 | 44 | . | . | . | . | . | . | . | . | . | 364 | . | . | . | . | | 524 | 556 |
| 13 | 45 | . | . | . | . | . | . | . | . | . | . | 397 | . | . | . | | 525 | 557 |
| 14 | 46 | . | . | . | . | . | . | . | . | . | . | . | 430 | . | . | | 526 | 558 |
| 15 | 47 | . | . | . | . | . | . | . | . | . | . | . | . | 463 | . | | 527 | 559 |
| 16 | 48 | . | . | . | . | . | . | . | . | . | . | . | . | . | 496 | | 528 | 560 |
| 17 | 49 | 81 | . | . | . | . | . | . | . | . | . | . | . | . | . | | 529 | 561 |
| 18 | 50 | . | 114 | . | . | . | . | . | . | . | . | . | . | . | . | | 530 | 562 |
| 19 | 51 | . | . | 147 | . | . | . | . | . | . | . | . | . | . | . | | 531 | 563 |
| 20 | 52 | . | . | . | 180 | . | . | . | . | . | . | . | . | . | . | | 532 | 564 |
| 21 | 53 | . | . | . | . | 213 | . | . | . | . | . | . | . | . | . | | 533 | 565 |
| 22 | 54 | . | . | . | . | . | 246 | . | . | . | . | . | . | . | . | | 534 | 566 |
| 23 | 55 | . | . | . | . | . | . | 279 | . | . | . | . | . | . | . | | 535 | 567 |
| 24 | 56 | . | . | . | . | . | . | . | 312 | . | . | . | . | . | . | | 536 | 568 |
| 25 | 57 | . | . | . | . | . | . | . | . | 345 | . | . | . | . | . | | 537 | 569 |
| 26 | 58 | . | . | . | . | . | . | . | . | . | 378 | . | . | . | . | | 538 | 570 |
| 27 | 59 | . | . | . | . | . | . | . | . | . | . | 411 | . | . | . | | 539 | 571 |
| 28 | 60 | . | . | . | . | . | . | . | . | . | . | . | 444 | . | . | | 540 | 572 |
| 29 | 61 | . | . | . | . | . | . | . | . | . | . | . | . | 477 | . | | 541 | 573 |
| 30 | 62 | . | . | . | . | . | . | . | . | . | . | . | . | . | 510 | | 542 | 574 |
| 31 | 63 | 95 | 127 | 159 | 191 | 223 | 255 | 287 | 329 | 351 | 383 | 415 | 447 | 479 | 541 | | 543 | 575 |
| 32 | 64 | 96 | 128 | 160 | 192 | 224 | 256 | 288 | 320 | 352 | 384 | 416 | 448 | 480 | 542 | | 544 | 576 |

↑
COLUMN

FIG. 3
BACKGROUND ART

FULL RATE

```
1  33 . . . . . .513 545
2  34 . . . . . .514 546
.  .  . . . . . .  .   .
.  .  . . . . . .  .   .
.  .  . . . . . .  .   .
.  .  . . . . . .  .   .
31 63 . . . . . .543 575
32 64 . . . . . .544 576
```

HALF RATE (ONE TIMES REPETITION)

```
1  17 . . . . . . 257 273
1  17 . . . . . . 257 273
.  .  . . . . . .  .   .
.  .  . . . . . .  .   .
.  .  . . . . . .  .   .
.  .  . . . . . .  .   .
16 32 . . . . . . 272 288
16 32 . . . . . . 272 288
```

QUARTER RATE (3 TIMES REPETITION)

```
1  9 . . . . . .129 137
1  9 . . . . . .129 137
1  9 . . . . . .129 137
1  9 . . . . . .129 137
.  . . . . . . .  .   .
.  . . . . . . .  .   .
8 16 . . . . . .136 144
8 16 . . . . . .136 144
```

EIGHT RATE (7 TIMES REPETITION)

INTERLEAVER ARRAY

ROW →

| 1 | 17 | 33 | 49 | 65 | 81 | 97 | 113 | 129 | 145 | 161 | 177 |
|---|----|----|----|----|----|----|-----|-----|-----|-----|-----|
| 2 | 18 | 34 | 50 | 66 | 82 | 98 | 114 | 130 | 146 | 162 | 178 |
| 3 | 19 | 35 | 51 | 67 | 83 | 99 | 115 | 131 | 147 | 163 | 179 |
| 4 | 20 | 36 | 52 | 68 | 84 | 100 | 116 | 132 | 148 | 164 | 180 |
| 5 | 21 | 37 | 53 | 69 | 85 | 101 | 117 | 133 | 149 | 165 | 181 |
| 6 | 22 | 38 | 54 | 70 | 86 | 102 | 118 | 134 | 150 | 166 | 182 |
| 7 | 23 | 39 | 55 | 71 | 87 | 103 | 119 | 135 | 151 | 167 | 183 |
| 8 | 24 | 40 | 56 | 72 | 88 | 104 | 120 | 136 | 152 | 168 | 184 |
| 9 | 25 | 41 | 57 | 73 | 89 | 105 | 121 | 137 | 153 | 169 | 185 |
| 10 | 26 | 42 | 58 | 74 | 90 | 106 | 122 | 138 | 154 | 170 | 186 |
| 11 | 27 | 43 | 59 | 75 | 91 | 107 | 123 | 139 | 155 | 171 | 187 |
| 12 | 28 | 44 | 60 | 76 | 92 | 108 | 124 | 140 | 156 | 172 | 188 |
| 13 | 29 | 45 | 61 | 77 | 93 | 109 | 125 | 141 | 157 | 173 | 189 |
| 14 | 30 | 46 | 62 | 78 | 94 | 110 | 126 | 142 | 158 | 174 | 190 |
| 15 | 31 | 47 | 63 | 79 | 95 | 111 | 127 | 143 | 159 | 175 | 191 |
| 16 | 32 | 48 | 64 | 80 | 96 | 112 | 128 | 144 | 160 | 176 | 192 |

COLUMN ↑

| ROW ADDRESS | 1 | 2 |
|---|---|---|
| OUTPUT DATA | 1 17 33 49 65 81 97 113 129 145 161 177 | 2 18 34 50 66 82 98 114 130 146 162 178 |
| ROW ADDRESS | 3 | 4 |
| OUTPUT DATA | 3 19 35 51 67 83 99 115 131 147 163 179 | 4 20 36 52 68 84 100 116 132 148 164 180 |
| ROW ADDRESS | 5 | 6 |
| OUTPUT DATA | 5 21 37 53 69 85 101 117 133 149 165 181 | 6 22 38 54 70 86 102 118 134 150 166 182 |
| ROW ADDRESS | 7 | 8 |
| OUTPUT DATA | 7 23 39 55 71 87 103 119 135 151 167 183 | 8 24 40 56 72 88 104 120 136 152 168 184 |
| ROW ADDRESS | 9 | 10 |
| OUTPUT DATA | 9 25 41 57 73 89 105 121 137 153 169 185 | 10 26 42 58 74 90 106 122 138 154 170 186 |
| ROW ADDRESS | 11 | 12 |
| OUTPUT DATA | 11 27 43 59 75 91 107 123 139 155 171 187 | 12 28 44 60 76 92 108 124 140 156 172 188 |
| ROW ADDRESS | 13 | 14 |
| OUTPUT DATA | 13 29 45 61 77 93 109 125 141 157 173 189 | 14 30 46 62 78 94 110 126 142 158 174 190 |
| ROW ADDRESS | 15 | 16 |
| OUTPUT DATA | 15 31 47 63 79 95 111 127 143 159 175 191 | 16 32 48 64 80 96 112 128 144 160 176 192 |

INTERLEAVER MEMORY ACCESS APPARATUS AND METHOD OF MOBILE COMMUNICATION SYSTEM

BACKGROUND OF THE INVENTION

1. Field of the Invention

The present invention relates to a mobile communication system, and more particularly, to an interleaver memory access apparatus and method of a mobile communication system.

2. Description of the Background Art

FIG. 1 is a schematic block diagram of a general mobile communication system

As shown in FIG. 1, the conventional mobile communication system includes a frame quality indicator 10 for attaching frame quality indicator bits indicating a transfer rate to a source data; a tail bit attaching unit 20 for attaching a tail bit of 8 bits to an output of the frame quality indicator 10; a convolutional encoder 30 for receiving a data bit from the tail bit attaching unit 20 and generating three code symbols (a serial data) per data bit; a code symbol repetition unit 40 for performing a symbol repetition in order to make the same data size as that of the full rate; an interleaver memory 50 for storing a code symbol outputted from the code symbol repetition unit 40 according to a row and column address outputted from the address generator 60; an orthogonal modulator 70 for receiving the code symbol from the interleaver memory 50, generating one Walsh index for each six code symbols and outputting 64 Walsh codes; and a radio frequency processing unit 80 for spread-modulating the 64 Walsh codes and transmitting a radio frequency signal.

The operation of the mobile communication system constructed as described above will now be explained with reference to the accompanying drawings. At this time, a data rate is assumed to be 4800 bps When a source data, an analog voice signal, is inputted to the mobile communication system, the corresponding source data is PCM-modulated and inputted to the frame quality indicator (FQI) 10 through a vocoder (not shown).

The frame quality indicator 10 attaches certain bit frame quality indicator bits indicating 4800 bps to the source data, and outputs a 4.4 kbps data bit, and the tail bit attaching unit 20 attaches 8 bit encoder tail bit to the 4.4 kbps data bit and outputs a 4.8 kbps data bit.

The convolutional encoder 30 generates three code symbols for each data bit outputted from the tail bit attaching unit 20 and outputs a 14.4 kbps code symbol.

The code symbol repetition unit 40 performs a code symbol repetition with respect to the output of the convolutional encoder 30 by one time and generates a 28.8 Kbps code symbol, in order to make the same data size as that of the full rate (9600 bps) At this time, if the data rate is 2400 bps, the code symbol repetition unit 40 performs three times of code symbol repetition, while if the data rate is 1200 bps, the code symbol repetition unit 40 performs seven times of code symbol repetition. Accordingly, the rate of the code symbols outputted form the code symbol repetition unit 40 has the same data size as that of the full rate.

As shown in FIG. 2, the interleaver memory 50 includes 32 rows and 18 columns and sequentially writes and reads code symbols outputted from the code symbol repetition unit 40 according to a row and column address outputted from the address generator 60

The orthogonal modulator 70 decodes the code symbols which is inputted from the interleaver memory 50 by 6 ones and generates one Walsh index and selectively outputs one of the 64 Walsh codes by using the generated Walsh index.

Accordingly, the radio frequency processing unit 80 spread-modulates the 4.8 Kbps Walsh code outputted from the orthogonal modulator 70, and converts it into a radio frequency signal to be transmitted.

The access operation of the interleaver memory 50 will now be described in detail.

The mobile communication system supports a variable data rate. Thus, the code symbol repetition unit 40 performs a code symbol repetition with respect to the data rates except for the full rate (9600 bps) in order to facilitate processing of data, i.e. a half rate (4800 bps), a quarter rate (2400 bps) and an eight rate (1200 bps).

The mobile communication system transmits a data through a radio interface However, since a data transmission through the radio interface may occur an unexpected data loss (error) due to various noises, a data interleaving is performed prior to performing a modulation/transmission of the code symbol in order to prevent a burst error.

In the conventional mobile communication system, a data interleaving is performed by the interleaver memory 50 and the address generator 60.

The interleaver memory 50 stores the code symbols outputted from the code symbol repetition unit 50 according to the row and column addresses outputted from the address generator 60.

That is, as shown by a normal interleaver memory map of FIG. 3, the code symbols outputted from the code symbol repetition unit 40 are stored in the interleaver memory 50 in the following order.

Full rate: 1 2 3 4 5 6 7 8 9 10 . . . 570 571 572 573 574 575 576

Half rate: 1 1 2 2 3 3 4 4 5 5 . . . 285 285 286 286 287 287 288 288

Quarter rate: 1 1 1 1 2 2 2 2 3 . . . 143 143 143 143 144 144 144 144

Eight rate: 1 1 1 1 1 1 1 1 2 2 . . . 71 71 71 72 72 72 72 72 72 72 72

When a writing operation is completed, a reading operation of the interleaver memory 50 is performed in the order defined by a mobile communication standard, that is, in the following order of row addresses in the normal interleaver memory map of FIG. 2.

Full rate: 1 2 3 4 5 6 7 8 9 10 . . . 25 26 27 28 29 30 31 32

Half rate: 1 3 2 4 5 7 6 8 9 11 . . . 25 27 26 28 29 31 30 32

Quarter rate: 1 5 2 6 3 7 4 8 . . . 25 29 26 30 27 31 28 32

Eight rate: 1 9 2 10 3 11 4 12 . . . 21 29 22 30 23 31 24 32

For example, assuming that the code symbols of the full rate are stored in the interleaver memory 50 in such a form as shown in FIG. 4, the address generator 60 changes the column address from 1 to 12 in a state that it has outputted one row address, so that 12 code symbols can be sequentially read from the interleaver memory 50. Code symbols of different data rates are read in the order of he same row address and column address as that of the full rate.

As aforementioned, in the conventional mobile communication system, the write operation of the interleaver memory is performed in the input order of the code symbols, and the reading operation is performed in the unit of row, and thus the data spreading is performed to cope with a burst error of a data while maintaining a continuity of the data.

In addition, the writing and reading operations of the interleaver memory are performed in the unit of bit. However, in order to read and write all of the code symbols of one frame of a serial data, the address (row and column) generation and the access operation(read and write) of the interleaver memory are to be repeatedly performed, which runs against achievement of a rapid data processing and a low power consumption The above references are incorporated by reference herein where appropriate for appropriate teachings of additional or alternative details, features and/or technical background.

SUMMARY OF THE INVENTION

An object of the present invention is to provide an interleaver memory access apparatus and method for attaining a lower power consumption and increasing a data access rate by improving an addressing and an access operation of an interleaver memory.

To achieve at least the above objects in whole or in parts, there is provided an interleaver memory access apparatus of a mobile communication system including an interleaver memory; a code symbol repetition unit for processing sequentially inputted code symbols according to a transfer rate and writing the code symbols by 1-column in the interleaver memory; a shift register unit for receiving the code symbols read 1-row by 1-row from the interleaver memory and storing them by a certain unit; and an address generation/control logic for controlling an access operation of the interleaver memory and the operation of the shift register unit.

To achieve at least these advantages in whole or in parts, there is further provided an interleaver memory access apparatus of a mobile communication system including a code symbol input unit for inputting a code symbol according to an input control signal; first and second switching units for switching code symbols outputted from the code symbol input unit according to first and second switching signals; first and second registers for storing code symbols outputted from first and second switching units; a code symbol output unit for simultaneously outputting the code symbols stored in first and second registers to the interleaver memory according to a transmission signal; and an address generation/control logic for controlling a clock timing of the input control signal, first and second switching signals and the transmission signal and controlling the addressing operation of the interleaver memory.

To achieve at least these advantages in whole or in parts, there is further provided an interleaver memory access method of a mobile communication system including the steps of changing an input path of a code symbol according to an input control signal, and selectively performing a symbol repetition; storing the symbol-repeated code symbols in a storing unit having the same size as the column size of an interleaver memory according to first and second switching signals; and writing the code symbols stored in the storing unit simultaneously in a column of the interleaver memory according to a transmission signal Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 2 is a drawing illustrating a normal interleaver memory map;

FIG. 3 is an example of an interleaver memory map for each data rate;

FIG. 8 is a drawing illustrating a read addressing of the interleaver memory and a corresponding data value in case of a full rate of FIG. 5.

DETAILED DESCRIPTION OF THE PREFERRED EMBODIMENTS

A preferred embodiment of the present invention will now be described with reference to the accompanying drawings.

The present invention proposes a method in which, when a writing operation of an interleaver memory is performed in the order defined by a mobile communication standard, code symbols outputted from a code symbol repetition unit are processed and a 1-column data is simultaneously written in the interleaver memory, and when a reading operation of the interleaver memory is performed, a 1-row data written in the interleaver memory is simultaneously read by using a row address.

Figure 1:
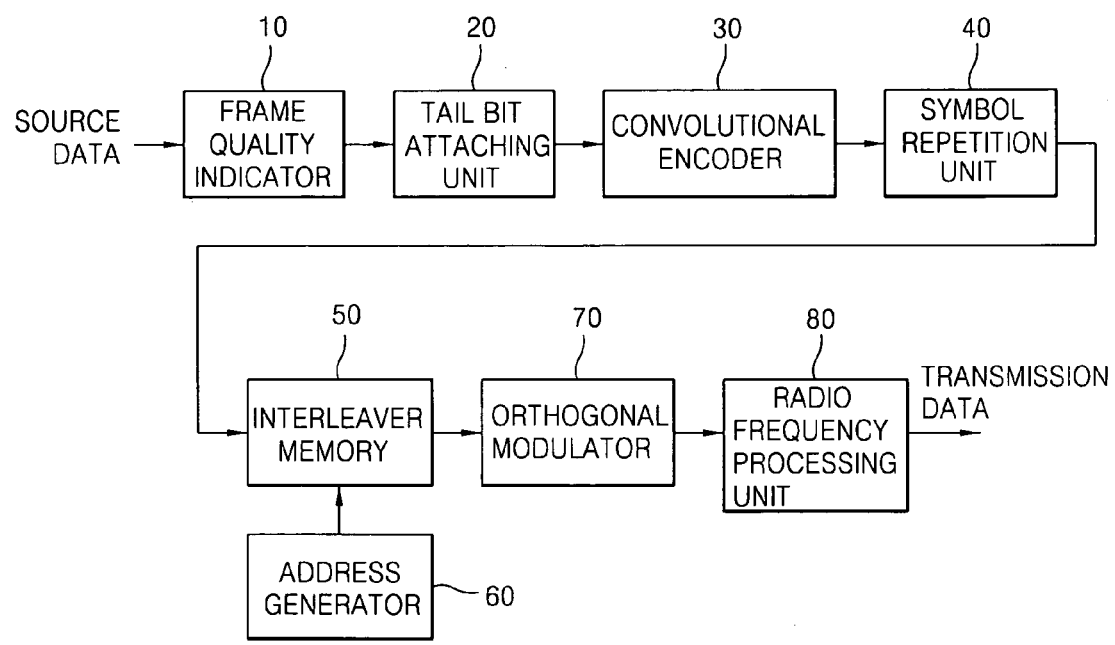
FIG. 1 is a schematic block diagram of a general mobile communication system.
Figure 4:
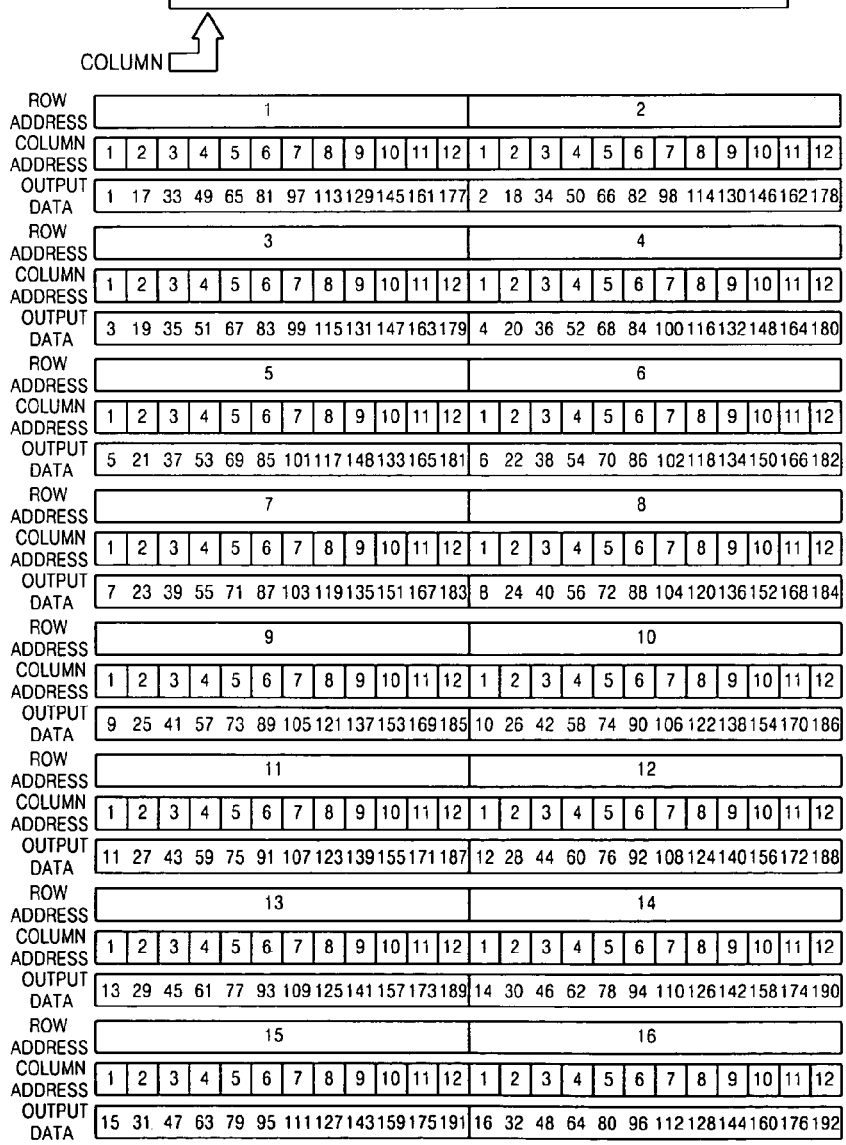
FIG. 4 a drawing illustrating a read addressing of an interleaver memory storing full rate code symbols and a corresponding data output value.
Figure 5:
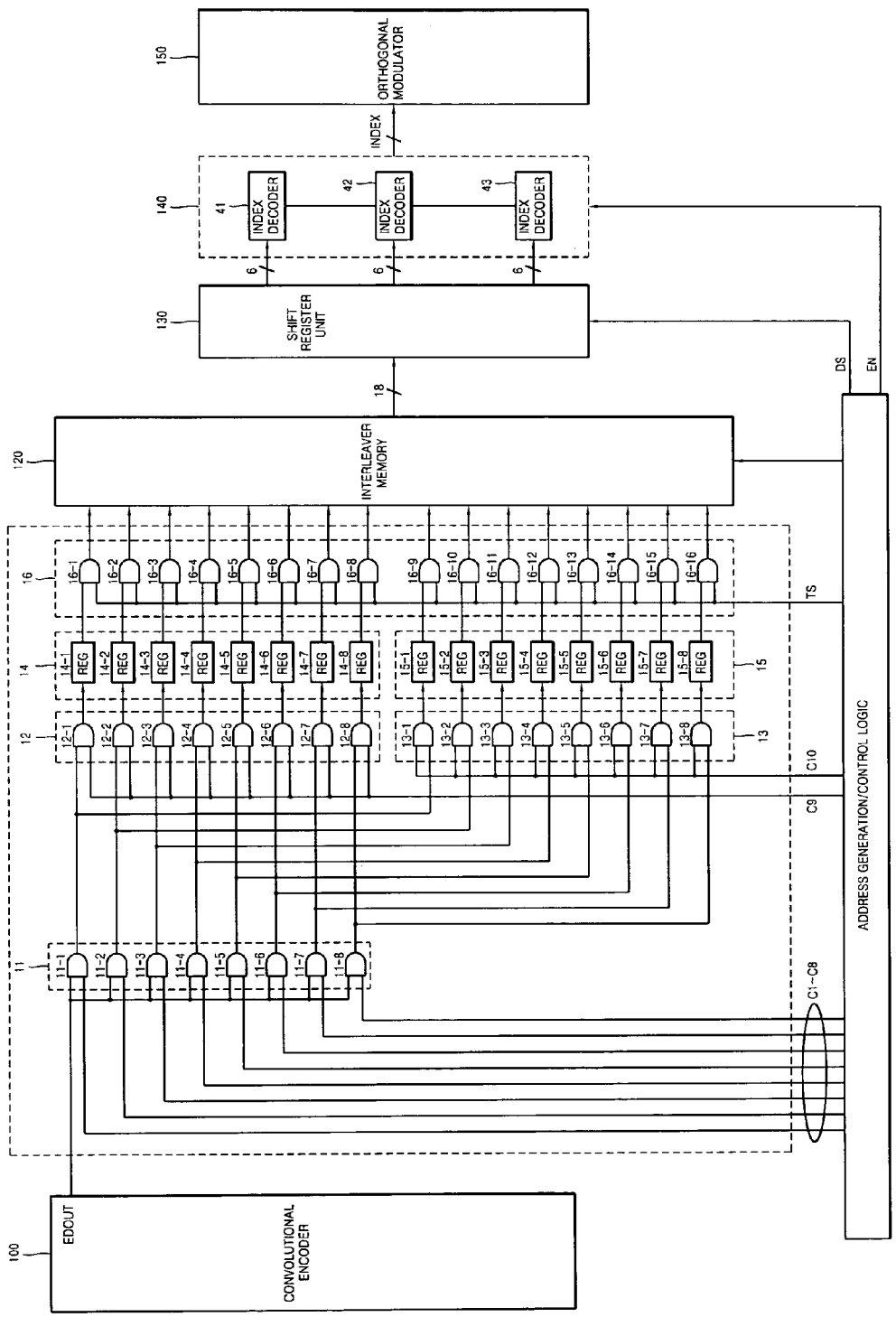
FIG. 5 is a block diagram of an interleaver memory access apparatus of a mobile communication system in accordance with the present invention.

As shown in FIG. 5, the interleaver memory access apparatus of a mobile communication system of the present invention includes a convolutional encoder 100; a code symbol repetition unit 110 for performing a symbol repetition on a code symbol (a serial data) outputted from the convolutional encoder 100; an interleaver memory 120 for simultaneously writing and reading a code symbol outputted from the code symbol repetition unit 110 according to a row address or a column address; a shift register unit 130 for receiving a 18 bit code symbol from the interleaver memory 120 and outputting it by 6 code symbols; an index decoding unit 140 for decoding 6 code symbols outputted from the shift register unit 130 and generating a Walsh index; an orthogonal modulator 150 for outputting 64 Walsh codes based upon the Walsh index outputted from the index decoding unit 140; and an address generation/control logic 160 for controlling an access operation of the interleaver memory 120 and input/output operations of the code symbol repetition unit 110, the shift register unit 130 and the index decoding unit 140.

The code symbol repetition unit 110 includes a code symbol input unit 11 for inputting a code symbol (Edout) outputted from the convolutional encoder 100 according to an input control signal (C1–C8); first and second switching units 12 and 13 for switching an code symbol outputted from the code symbol input unit 11 according to first and second switching signals C9 and C10 of the address generation/control logic 160; first and second register units 14 and 15 for storing the code symbols outputted from first and second switching units 12 and 13; and a code symbol output unit 16 for simultaneously outputting the code symbols of 16 bit size stored in first and second register units 14 and 16 to the interleaver memory 120 according to a transmission signal (TS).

The code symbol input unit 11 includes a plurality of AND gates, and the number of the AND gates is determined depending on the number of maximum symbol repetition. That is, the present invention supports the transfer rate of the full rate, a half rate, a quarter rate and an eight rate, and especially, in case of an eight rate, the symbol repetition is performed seven times at the maximum, the code symbol input unit 11 includes 8 AND gates (11-1~11-8) as shown in FIG. 5.

Sizes of first and second switching units 12 and 13, first and second register units 14 and 15, and the code symbol output unit 16 are determined by a column size of the interleaver memory 120.

Currently, the column size of the interleaver memory 120 is set by 16 bits, so that first and second switching units 12 and 13 respectively include 8 AND gates (12-1~12-8) and (13-1~13-8).

The first and second register units 14 and 15 respectively include 8 registers (14-1~14-8) and (15-1~15-8), and the code symbol output unit 16 includes 16 AND gates (16-1~16-16).

The interleaver memory 120 is constructed as a 576 bit memory bank, and the shift register unit 130 has a structure that 2 shift registers are connected in series so that, while one shift register performs a reading operation, the other shift register can perform a writing operation Each shift register is divided into three storage regions, which sequentially output 6 code symbols according to a data select signal (DS) of the address generation/control logic 160.

The index decoding unit 140 includes first~third index decoders 41~43 receiving 6 code symbols from the shift register 130 and generating one Walsh index. The first~third index decoders 41~43 are activated by an enable signal (EN) outputted from the address generation/control logic 160.

The operation of the interleaver memory access apparatus constructed as described above will now be explained with reference to the accompanying drawings.

In the present invention, when a writing operation of the interleaver memory 120 is performed in the order defined by the mobile communication standard, code symbols outputted from the code symbol repetition unit 110 are processed and 1-column data is written in the interleaver memory 120.

1) Full rate

Figure 6:
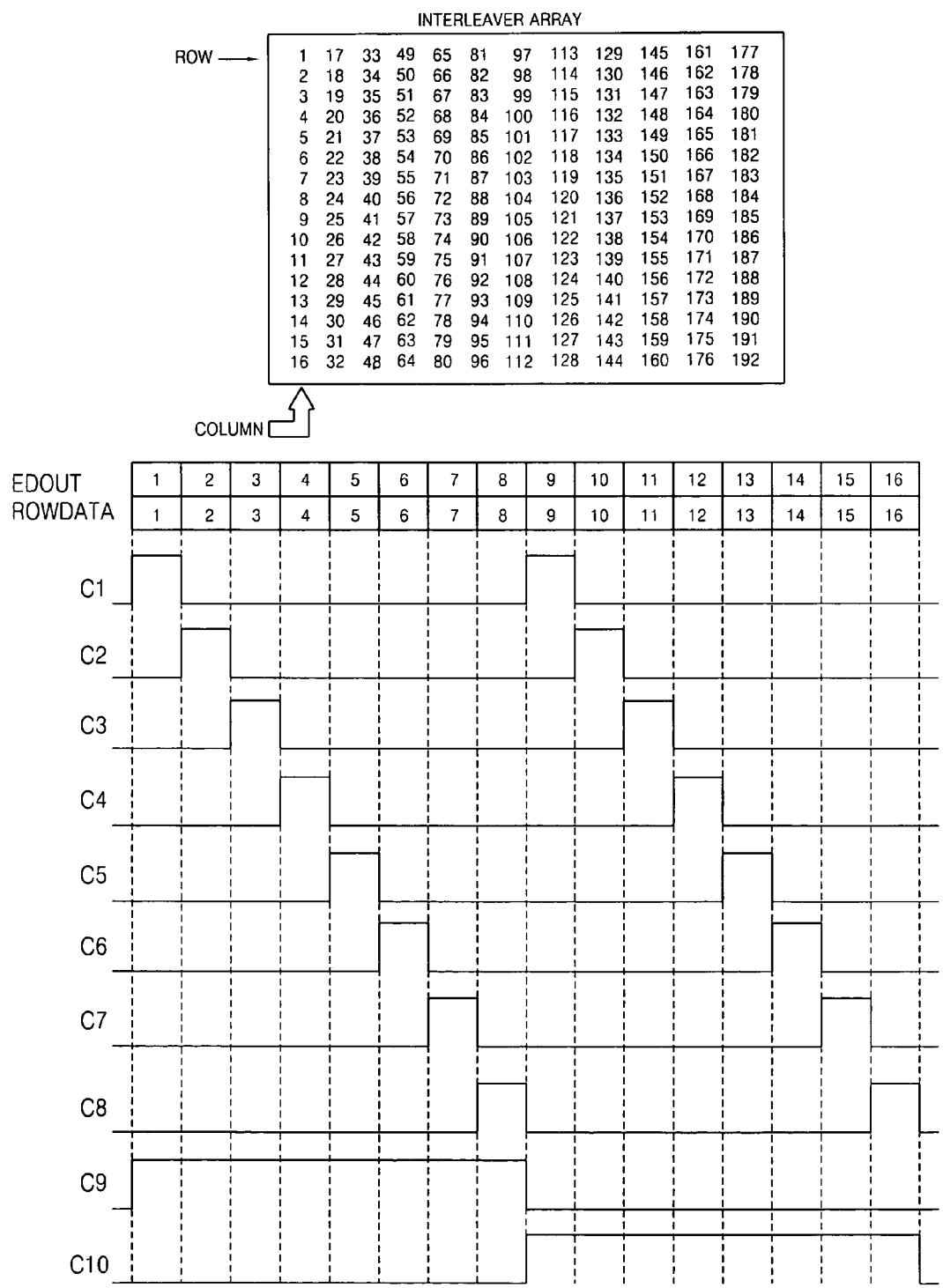
FIG. 6 is a drawing illustrating a write addressing of an interleaver memory and a corresponding data value in case of a full rate of FIG. 5.

In case that a transfer rate is a full rate, as shown in FIG. 6, the address generation/control logic 160 first enables sequentially control signals C1~C8 and then enables the first switching signal C9 during the enabling interval of the control signal (C1~C8).

The AND gates 11-1~11-8 of the code symbol input unit 11 sequentially receive the code symbols (Edout) (1, 2, 3, . . . ) from the convolutional encoder 100 and generates code symbols 1~8 of 8 bit size, and AND gates 12-1~12-8 of the first switching unit 12 store the generated code symbols 1–8 of 8 bit size in the registers (Reg) (14-1~14-8) of the first register unit 14 according to first switching signal C9.

When the code symbols (1–8) are completely stored, the address generation/control logic 160 enables the input control signals (C1–C8) and the second switching signal (C10) in the same manner.

Accordingly, the first switching unit 12 stops its operation and the second switching unit 13 starts its operation by the second switching control signal (C10), thus the code symbols 9–16 of 8 bit size outputted from the AND gates 11-1~11-8 of the code symbol input unit 11 are stored in the registers (Reg) (15-1~15-8) through the AND gates (13-1~13-8) of the second switching unit 13. At this time, first and second switching signals are alternately switched for every 8 clock cycle time.

When the code symbols 1–16 of 16 bit size are all stored in the first and second register units 13 and 14, the address generation/control logic 160 enables the transmission signal (TS), thus the code symbols (1–16) of 16 bit size stored in the first and second register units 14 and 15 are simultaneously written in the 1-column of the interleaver memory 120 through the AND gates 16-1~16-16 of the code symbol output unit 16. At this time, the column is assigned by the address generation/control logic 160, and the first and second switching signals are alternately switched for every 8 clock cycle time.

2) Half rate

Figure 7:
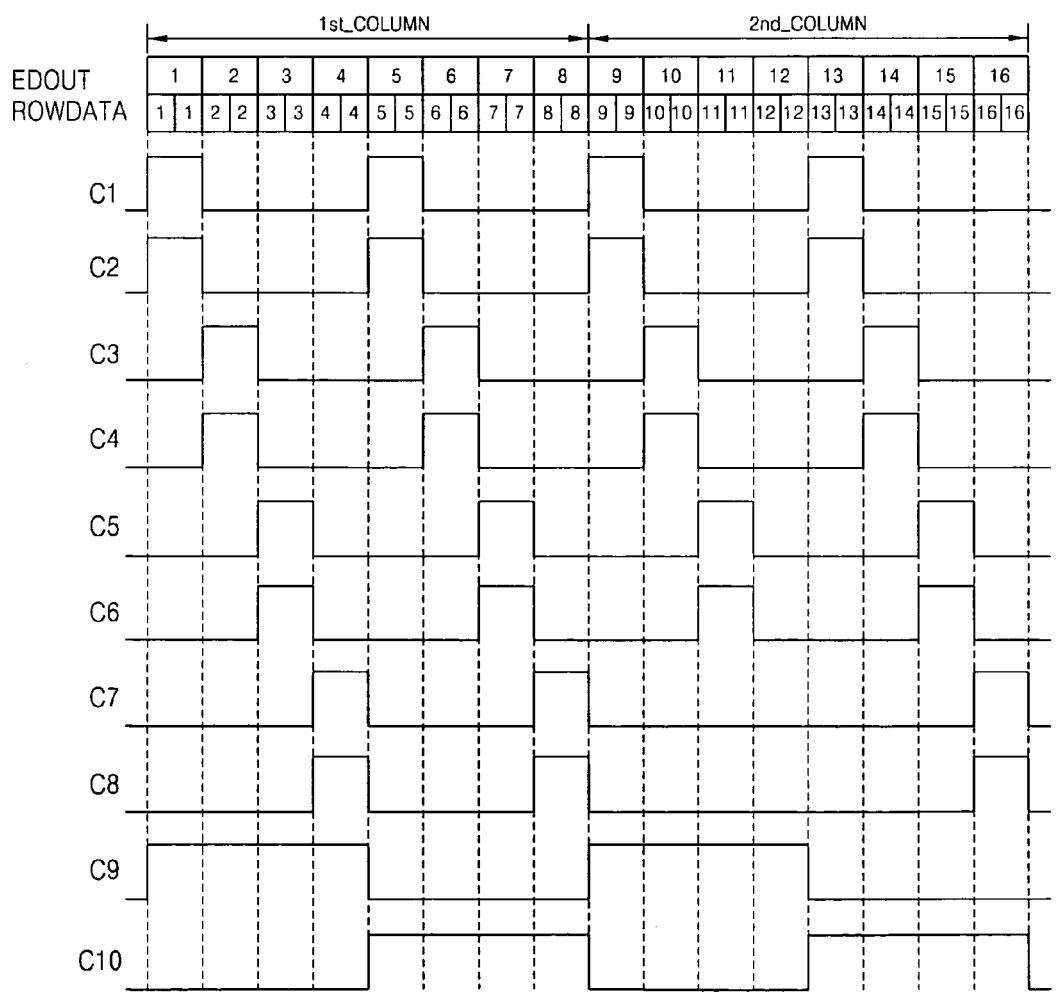
FIG. 7 is a drawing illustrating a write addressing of an interleaver memory and a corresponding data value in case of a half rate of FIG. 5.

In case that a transfer rate is a half rate, as shown in FIG. 7, the address generation/control logic 160 sequentially enables a pair of input control signals (Cn, Cn_1) (n=1, . . . , 8) and also enables the first switching signal (C9).

The code symbol input unit 11 sequentially receives the code symbols (Edout) (1,2,3, . . . , ) from the convolutional encoder 100 and outputs code symbols (1,1,2,2,3,3,4,4) of 8 bit size according to the input control signals (C1–C8), and the first switching unit 12 stores the 8 bit size code symbols (1,1,2,2,3,3,4,4) in the first register unit 14 according to the first switching signal (C9).

After the code symbols (1,1,2,2,3,3,4,4) are completely stored, the address generation/control logic 160 enables the input control signals (C1–C8) and the second switching signal (C10) in the same manner.

At this time, the code symbol input unit 11 sequentially receives the code symbols (Edout) (5–8) from the convolutional encoder 100 and outputs code symbols (5,5,6,6,7,7,8,8) of 8 bit size, and the second switching unit 13 stores the 8 bit size code symbols (5,5,6,6,7,7,8,8) in the second register unit 16. The first and second switching signals are alternately switched for every half of the full rate, that is, for every 4 clock cycle time.

When the code symbols of 16 bit size are all stored in the first and second register units 14 and 16, the address generation/control logic 160 enables the transmission signal (TS), thus the code symbols stored in the first and second register units 14 and 15 can be simultaneously written in the 1-column of the interleaver memory 120 through the code symbol output unit 16. The same method is applied to the code symbols 9–16.

Meanwhile, in case of the quarter rate and the eight rate, symbol repetition are performed 3 times and 7 times on the code symbols (Edout) outputted from the convolutional encoder 100 by using the input control signals (C1–C8) and then the timing of the first and second switching signals (C9, C10) is controlled, so that the code symbols of 16 bit size stored in the first and second register units 14 and 15 can be simultaneously written in the interleaver memory 120.

At this time, in case that the transfer rate is the quarter rate, the first and second switching signals are alternately switched for every 2 clock cycle time, while in case that the transfer rate is the eight rate, the first and second switching signals are alternately switched for every 1 clock cycle time.

In this manner, when the writing operation of the interleaver memory 120 is performed, since the column address is used, the code symbols outputted from the symbol repetition unit 110 can be written in the interleaver memory 120 1-column by 1-column, thereby improving a data processing speed.

In addition, when the reading operation of the interleaver memory 120 is performed in the order defined by the mobile communication standard, the row address is used.

Thus, when a row address is inputted from the address generating and controlling logic 160, the 1-row data written in the interleaver memory 120 is simultaneously read.

For example, on the assumption that code symbols of full rate are stored in the interleaver memory 120 in such a form as shown in FIG. 8, the interleaver memory 120 outputs the code symbols of 1-row at one time according to the row addresses (1, . . . , 16) sequentially inputted from the address generation/control logic 160 That is the row address serves like the transmission signal of the symbol code.

Figure 9:
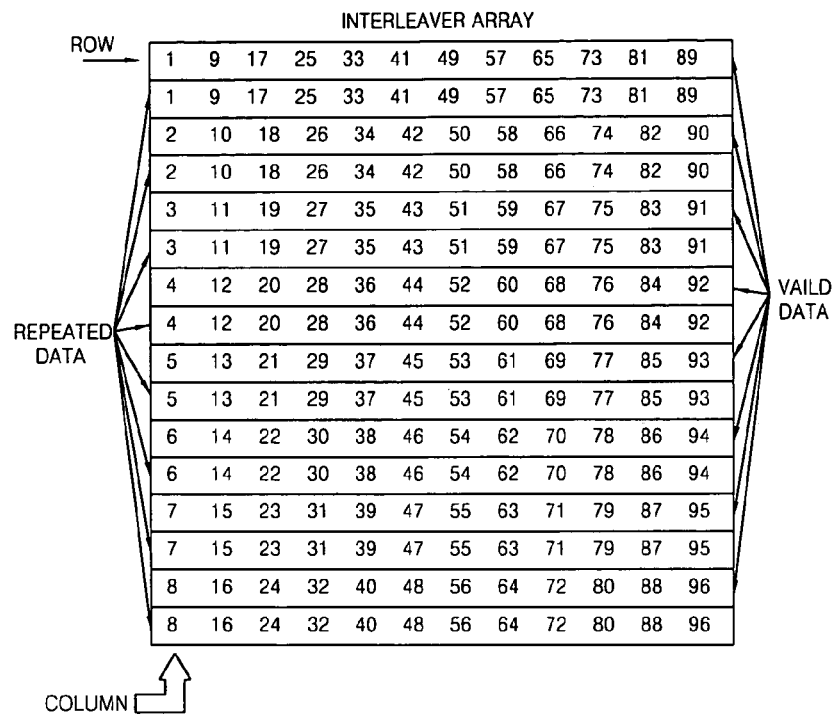
FIG. 9 is a drawing illustrating a read addressing of the interleaver memory and a corresponding data value in case of a half rate of FIG. 5.

On the assumption that code symbols of the half rate are stored in the interleaver memory 120 in such a form as shown in FIG. 9, the interleaver memory 120 outputs the code symbols of 1-row at one time according to the row addresses (1 3 5 7 9 11 13 15) inputted from the address generation/control logic 160.

At this time, the code symbols stored in the even number rows of the interleaver memory 120 are the code symbols repeatedly stored for facilitating data processing, which are the same as the code symbols of each previous row.

Accordingly, as shown in FIG. 9, rather than reading the code symbols stored in the even number rows of the interleaver memory 120, the data select signal (DS) is outputted to repeatedly access the code symbols of the previous row which have been already transmitted to the shift register 130, to thereby replace the access operation of the code symbols stored in the even number rows.

The first through the third index decoders 41–43 of the index decoding unit 160 are sequentially activated according to the enable signal (EN) outputted from the address generation/control logic 160, decode the 6 code symbols inputted from the shift register 130 and generate one Walsh index, respectively.

Thus, the orthogonal modulator 150 generates and outputs 64 Walsh code according to the Walsh index outputted from the first through the third index decoders 41–43.

In the above descriptions, the examples of the full rate and the half rate were explained but cases of the quarter rate and the eight rate can have the same operations and effects.

As so far described, the interleaver memory access apparatus and method of a mobile communication system of the present invention has the following advantage.

That is, when the writing operation of the interleaver memory is performed, the code symbols outputted from the code symbol repetition unit are processed and the 1-column data is simultaneously written in the interleaver memory, so that the data processing speed can be improved The foregoing embodiments and advantages are merely exemplary and are not to be construed as limiting the present invention. The present teaching can be readily applied to other types of apparatuses The description of the present invention is intended to be illustrative, and not to limit the scope of the claims Many alternatives, modifications, and variations will be apparent to those skilled in the art In the claims, means-plus-function clauses are intended to cover the structure described herein as performing the recited function and not only structural equivalents but also equivalent structures.

What is claimed is:

1. An interleaver memory access apparatus of a mobile communication system comprising:
an interleaver memory;
a code symbol repetition unit for processing sequentially inputted code symbols according to a transfer rate and writing the code symbols by 1-column in the interleaver memory;
a shift register unit for receiving the code symbols read by 1-row from the interleaver memory and storing them in a certain unit; and
an address generation/control logic for controlling operations of the interleaver memory and the shift register unit, wherein the code symbol repetition unit comprises:
code symbol input unit for inputting code symbols according to an input control signal of the address generation/control logic;
first and second switching units for switching the code symbols outputted from the code symbol in put unit according to first and second switching signals of the address generation/control logic;
first and second register units for storing code symbols outputted from the first and second switching units; and
a code symbol output unit for stimultaneously outputting code symbols stored in the first and second register units, to the interleaver memory according to a transmission signal of the address generation/control logic.

2. The apparatus of claim 1, wherein the code symbol input unit includes a plurality of AND gates, and the number of the AND gates is determined based upon the number of maximum symbol repetition.

3. The apparatus of claim 2, wherein the input control signals are sequentially enabled in case that a transfer rate is a full rate, and are simultaneously enabled by one pair in case that a transfer rate is a half rate.

4. The apparatus of claim 2, wherein the input control signals are simultaneously enabled by four pairs in case that a transfer rate is a quarter rate, and are all enabled in case that a transfer rate is an eight rate.

5. The apparatus of claim 1, wherein the first and second switching units respectively include plural AND gates which correspond to the half column size of the interleaver memory.

6. The apparatus of claim 5, wherein the first and second switching units are alternately switched according to the first and second switching signals.

7. The apparatus of claim 6, wherein the first and second switching signals are respectively switched for every 8 clock cycle time in case that a transfer rate is the full rate, and switched for every 4 clock cycle time in case that a transfer rate is the half rate.

8. The apparatus of claim 6, wherein the first and second switching signals are respectively switched for every 2 clock cycle time in case that a transfer rate is the quarter rate, and switched for every one clock cycle time in case that a transfer rate is the eight rate.

9. The apparatus of claim 1, wherein the code symbol output unit includes plural AND gates which correspond to the column size of the interleaver memory.

10. An interleaver memory access apparatus of a mobile communication system comprising:
- a code symbol input unit for inputting a code symbol according to an input control signal;
- first and second switching units for switching code symbols outputted from the code symbol input unit according to first and second switching signals;
- first and second registers for storing code symbols outputted from the first and second switching units;
- a code symbol output unit for simultaneously outputting the code symbols stored in the first and second registers to the interleaver memory according to a transmission signal; and
- an address generation/control logic for controlling a clock timing of the input control signal, the first and second switching signals and the transmission signal and controlling the addressing operation of the interleaver memory.

11. The apparatus of claim 10, wherein the code symbol input unit includes plural AND gates, and the number of the AND gates is determined based upon the number of maximum symbol repetition.

12. The apparatus of claim 10, wherein the input control signals are sequentially enabled in case that a transfer rate is a full rate, and are simultaneously enabled by one pair in case that a transfer rate is a half rate.

13. The apparatus of claim 10, wherein the input control signals are simultaneously enabled by four pairs in case that a transfer rate is a quarter rate, and are all enabled in case that a transfer rate is an eight rate.

14. The apparatus of claim 10, wherein the first and second switching units respectively include a plurality of AND gates which correspond to the half column size of the interleaver memory, and the first and second switching units are alternately switched according to first and second switching signals.

15. The apparatus of claim 10, wherein the code symbol output unit includes plural AND gates which correspond to the column size of the interleaver memory.

16. An interleaver memory access method of a mobile communication system comprising the steps of:
- changing an input path of a code symbol according to an input control signal, and selectively performing a symbol repetition;
- storing the repeated code symbols in a storing unit having the same size as the column size of an interleaver memory according to first and second switching signals; and
- writing the code symbols stored in the storing unit simultaneously in a column of the interleaver memory according to a transmission signal.

17. The method of claim 16, wherein the input control signals are enabled by one bit in case that a transfer rate is a full rate, and simultaneously enabled by two bits in case that a transfer rate is a half rate.

18. The method of claim 17, wherein the input control signals are simultaneously enabled by 4 bits in case that a transfer rate is a quarter rate, and all enabled in case that a transfer rate is an eight rate.

19. The method of claim 16, wherein the first and second switching signals are alternately switched according to first and second switching signals.

* * * * *